(12) United States Patent
Mori et al.

(10) Patent No.: US 8,791,020 B2
(45) Date of Patent: Jul. 29, 2014

(54) SILICON-CONTAINING FILM, RESIN COMPOSITION, AND PATTERN FORMATION METHOD

(75) Inventors: Takashi Mori, Tokyo (JP); Masato Tanaka, Tokyo (JP); Yukio Nishimura, Tokyo (JP); Yoshikazu Yamaguchi, Tokyo (JP)

(73) Assignee: JSR Corporation, Tokyo (JP)

( * ) Notice: Subject to any disclaimer, the term of this patent is extended or adjusted under 35 U.S.C. 154(b) by 455 days.

(21) Appl. No.: 13/193,555

(22) Filed: Jul. 28, 2011

(65) Prior Publication Data

US 2012/0129352 A1 May 24, 2012

Related U.S. Application Data

(63) Continuation of application No. PCT/JP2010/050354, filed on Jan. 14, 2010.

(30) Foreign Application Priority Data

Jan. 28, 2009 (JP) ................................ 2009-016885

(51) Int. Cl.
*H01L 21/311* (2006.01)

(52) U.S. Cl.
USPC ........... 438/694; 438/455; 438/703; 257/734; 257/E21.231

(58) Field of Classification Search
CPC ................... H01L 21/31144; H01L 21/02214; H01L 21/02216; H01L 21/02126
USPC ........... 257/734, E21.231; 438/455, 754, 703
See application file for complete search history.

(56) References Cited

U.S. PATENT DOCUMENTS

| 5,772,905 A | 6/1998 | Chou |
| 5,956,216 A | 9/1999 | Chou |
| 6,576,393 B1 | 6/2003 | Sugita et al. |

FOREIGN PATENT DOCUMENTS

| JP | 2008-170984 | 7/2000 |
| JP | 2000-356854 | 12/2000 |
| JP | 2002-40668 | 2/2002 |
| JP | 2006-310565 | 11/2006 |
| JP | 2006-310566 | 11/2006 |
| JP | 2008-3624 | 1/2008 |

OTHER PUBLICATIONS

Japanese Office Action for corresponding JP Application No. 2010-548464, Jun. 25, 2013.
International Search Report for International Application No. PCT/JP2010/050354, Feb. 16, 2010.
International Preliminary Report on Patentability with Translation of Written Opinion of the International Searching Authority for International Application No. PCT/JP2010/050354, Aug. 9, 2011.
S. Y. Chou et al., "Imprint of Sub-25 nm Vias and Trenches in Polymers", Applied Physics Letters, 1995, p. 3114-3116, vol. 67.

*Primary Examiner* — Mark A Laurenzi
(74) *Attorney, Agent, or Firm* — Ditthavong & Steiner, P.C.

(57) ABSTRACT

A pattern-forming method includes forming a silicon-containing film on a substrate, the silicon-containing film having a mass ratio of silicon atoms to carbon atoms of 2 to 12. A shape transfer target layer is formed on the silicon-containing film. A fine pattern is transferred to the shape transfer target layer using a stamper that has a fine pattern to form a resist pattern. The silicon-containing film and the substrate are dry-etched using the resist pattern as a mask to form a pattern on the substrate in nanoimprint lithography. According to another aspect of the invention, a silicon-containing film includes silicon atoms and carbon atoms. A mass ratio of silicon atoms to carbon atoms is 2 to 12. The silicon-containing film is used for a pattern-forming method employed in nanoimprint lithography.

5 Claims, 1 Drawing Sheet

SILICON-CONTAINING FILM, RESIN COMPOSITION, AND PATTERN FORMATION METHOD

CROSS-REFERENCE TO RELATED APPLICATIONS

The present application is a continuation application of International Application No. PCT/JP2010/050354, filed Jan. 14, 2009, which claims priority to Japanese Patent Application No. 2009-016885, filed Jan. 28, 2009. The contents of this application are incorporated herein by reference in their entirety.

BACKGROUND OF THE INVENTION

1. Field of the Invention

The invention relates to a silicon-containing film, a resin composition, and a pattern-forming method.

2. Discussion of the Background

Advanced microfabrication technology is required to increase the degree of integration of a circuit of a semiconductor device or the like, and increase the recording density. Photolithographic technology that utilizes an exposure process enables large-area microfabrication, but does not provide a resolution equal to or less than the wavelength of light. In recent years, photolithographic technology that utilizes short-wavelength light (e.g., 193 nm (ArF), 157 nm ($F_2$), or 13.5 nm (EUV)) has been developed. However, since the material used for the photolithographic technology has been limited along with a decrease in wavelength of light, a fine structure that can be formed by the photolithographic technology is limited.

Electron-beam lithography, focused ion beam lithography, or the like can produce a fine structure with high resolution irrespective of the wavelength of light, but can achieve only a poor throughput.

A nanoimprint method can produce a fine structure having dimensions equal to or less than the wavelength of light with high throughput by pressing a stamper that has a specific fine elevation/depression pattern formed by electron-beam lithography or the like against a substrate to which a resist is applied, so that the elevations and depressions of the stamper are transferred to the resist film formed on the substrate (see: S. Y. Chou, Nano Imprint Lithography technology, Applied Physics Letters, Vol. 76, 1995, p. 3114, SPIE Microlithography Conference, Feb. 2005, U.S. Pat. Nos. 5,772,905 and 5,956,216, for example).

When forming a pattern in the production of semiconductor devices or the like, microfabrication of a substrate formed of an organic material or an inorganic material is implemented using a pattern-transfer method that utilizes lithographic technology, a resist development process, and etching technology. Specifically, an underlayer film (silicon-containing film) is formed on an oxide film or an interlayer dielectric formed on a substrate, a resist pattern is transferred to the underlayer film, and the oxide film or the interlayer dielectric is dry-etched using the underlayer film as a mask (multilayer resist process) (see Japanese Patent Application Publication (KOKAI) No. 2000-356854 and Japanese Patent Application Publication (KOKAI) No. 2002-40668, for example).

It has been considered to apply the multilayer resist process to the nanoimprint method. A silicon-containing film used for the nanoimprint method must exhibit excellent adhesion to the resist as compared with a silicon-containing film used for other applications.

When using the nanoimprint method, since the resist layer is formed in the space between the protrusion of the stamper and the substrate, the resulting pattern necessarily includes a residual layer. The residual layer is removed by dry etching or the like when processing the substrate (e.g., semiconductor substrate). However, if the resist has permeated the silicon-containing film, the dry etching conditions must be made severe. In this case, the resist pattern may be significantly damaged, so that the substrate may not be appropriately processed. Therefore, a silicon-containing film that can suppress permeation of the resist material (shape transfer target layer-forming composition) is desired.

SUMMARY OF THE INVENTION

According to one aspect of the present invention, a pattern-forming method includes forming a silicon-containing film on a substrate. The silicon-containing film has a mass ratio of silicon atoms to carbon atoms of 2 to 12. A shape transfer target layer is formed on the silicon-containing film. A fine pattern is transferred to the shape transfer target layer using a stamper that has a fine pattern to form a resist pattern. The silicon-containing film and the substrate are dry-etched using the resist pattern as a mask to form a pattern on the substrate in nanoimprint lithography.

According to another aspect of the invention, a silicon-containing film includes silicon atoms and carbon atoms. A mass ratio of silicon atoms to carbon atoms is 2 to 12. The silicon-containing film is used for a pattern-forming method employed in nanoimprint lithography. The method includes forming the silicon-containing film on a substrate. A shape transfer target layer is formed on the silicon-containing film. A fine pattern is transferred to the shape transfer target layer using a stamper that has a fine pattern to form a resist pattern. The silicon-containing film and the substrate are dry-etched using the resist pattern as a mask to form a pattern on the substrate.

According to further aspect of the present invention, a resin composition is used to form the silicon-containing film. The resin composition includes a resin including a structural unit obtained by hydrolyzing a compound shown by the following formula (1), $$SiX_4 \tag{1}$$

wherein X individually represent an alkoxy group or a halogen atom.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
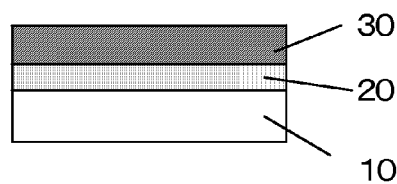
FIG. 1A, FIG. 1B, FIG. 1C, FIG. 1D, FIG. 1E and FIG. 1F are schematic views illustrating a pattern-forming method of an embodiment of the invention.

The embodiments will now be described with reference to the accompanying drawings, wherein like reference numerals designate corresponding or identical elements throughout the various drawings. Embodiments of the invention provide the followings.

[1] A pattern-forming method employed in nanoimprint lithography, the method including (1) forming a silicon-containing film on a substrate, the silicon-containing film having a mass ratio of silicon atoms to carbon atoms of 2 to 12, (2) forming a shape transfer target layer on the silicon-containing film, and transferring a fine pattern to the shape transfer target layer using a stamper that has a fine pattern to form a resist pattern, and (3) dry-etching the silicon-containing film and the substrate using the resist pattern as a mask to form a pattern on the substrate.

[2] The pattern-forming method according to [1], wherein the silicon-containing film has a silicon atom content of 36 to 47 mass % based on total atoms included in the silicon-containing film.

[3] The pattern-forming method according to [1] or [2], wherein the silicon-containing film includes a silicon atom, a carbon atom, and an oxygen atom.

[4] A silicon-containing film that is used for a pattern-forming method employed in nanoimprint lithography, the method including (1) forming a silicon-containing film on a substrate, (2) forming a shape transfer target layer on the silicon-containing film, and transferring a fine pattern to the shape transfer target layer using a stamper that has a fine pattern to form a resist pattern, and (3) dry-etching the silicon-containing film and the substrate using the resist pattern as a mask to form a pattern on the substrate, the silicon-containing film having a mass ratio of silicon atoms to carbon atoms of 2 to 12.

[5] A resin composition that is used to form the silicon-containing film according to [4], the resin composition including a resin that includes a structural unit obtained by hydrolyzing a compound shown by the following formula (1), $$SiX_4 \qquad (1)$$

wherein X individually represent an alkoxy group or a halogen atom.

According to the above pattern-forming method, since the silicon-containing film has a mass ratio of silicon atoms to carbon atoms of 2 to 12, the silicon-containing film exhibits excellent adhesion to a resist pattern, and suppresses permeation of a resist material (i.e., the silicon-containing film may suitably used for nanoimprint lithography).

When the silicon-containing film has a silicon atom content of 36 to 47 mass % based on total atoms included in the silicon-containing film, the silicon-containing film exhibits more excellent adhesion to the resist.

When the silicon-containing film includes a silicon atom, a carbon atom, and an oxygen atom, permeation of the resist material can be more advantageously suppressed.

Since the above silicon-containing film exhibits excellent adhesion to the resist, and suppresses permeation of the resist material, the silicon-containing film may suitably used for the above pattern-forming method.

The above silicon-containing film may be easily formed by utilizing a resin composition including a resin that includes a structural unit obtained by hydrolyzing a compound shown by the formula (1).

Exemplary embodiments of the invention are described in detail below.

[1] Silicon-Containing Film

A silicon-containing film according to one embodiment of the invention is used for a pattern-forming method employed in nanoimprint lithography, and has a mass ratio of silicon atoms to carbon atoms of 2 to 12.

The silicon-containing film preferably has a silicon atom content of 34 to 47 mass % based on total atoms included in the silicon-containing film. The silicon-containing film preferably includes a silicon atom, a carbon atom, and an oxygen atom.

When the silicon-containing film has a mass ratio of silicon atoms to carbon atoms of 2 to 12, the silicon-containing film exhibits excellent adhesion to a resist pattern, and suppresses permeation of a resist material. The silicon-containing film preferably has a mass ratio of silicon atoms to carbon atoms of 2 to 10, and more preferably 2 to 6. If the silicon-containing film has a mass ratio of silicon atoms to carbon atoms of more than 12, the silicon-containing film has a composition that significantly differs from that of a resist pattern formed on the silicon-containing film. In this case, the silicon-containing film may not exhibit excellent adhesion to the resist pattern.

When the silicon-containing film has a silicon atom content of 36 to 47 mass % based on total atoms included in the silicon-containing film, the silicon-containing film exhibits excellent dry etching resistance (particularly mask resistance during dry etching using oxygen) and excellent adhesion to a resist pattern. The silicon-containing film preferably has a silicon atom content of 41 to 44 mass %.

When the silicon-containing film includes a silicon atom, a carbon atom, and an oxygen atom, the silicon-containing film exhibits excellent adhesion to a resist pattern, suppresses permeation of a resist material, and exhibits excellent dry etching resistance.

The mass ratio of silicon atoms to carbon atoms included in the silicon-containing film may be determined by organic elementary analysis. Specifically, the silicon-containing film is converted into $H_2O$, $CO_2$, and $N_2$ by combustion (decomposition), the carbon atom content and the silicon atom content in each component are determined using a thermal conductivity detector, and the mass ratio of silicon atoms to carbon atoms is calculated. For example, an organic elementary analyzer ("CHN Corder JM10" manufactured by J-Science) or the like may be used for organic elementary analysis.

The silicon-containing film may be formed by an arbitrary method. For example, the silicon-containing film may be formed by applying a resin composition described later, or may be formed by deposition (e.g., chemical vapor deposition, physical vapor deposition, or molecular beam epitaxy). It is preferable to form the silicon-containing film by applying a resin composition from the viewpoint of productivity.

For example, the silicon-containing film may be formed by applying a resin composition described later to a substrate by spin coating, roll coating, dipping, or the like to form a film of the resin composition, and curing the film by heating or application of ultraviolet rays and heating (when the resin composition includes a latent photoacid generator). The heating temperature is normally 50 to 450° C.

The silicon-containing film may be deposited using a silane gas. Examples of the silane gas include silicon-containing compounds such as ethyl silicate (tetraethyl orthosilicate) (TEOS: $Si(OC_2H_5)_4$), trimethylsilane (TMS: $(CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

The thickness of the silicon-containing film is not particularly limited, but is normally (or preferably) 10 to 200 nm.

[2] Resin Composition

A resin composition according to one embodiment of the invention produces a silicon-containing film having a mass ratio of silicon atoms to carbon atoms of 2 to 12, and normally includes (A) a polysiloxane and (B) an organic solvent.

(1) Polysiloxane (A)

The polysiloxane (A) preferably includes a structural unit obtained by hydrolyzing a compound shown by the following formula (1) so that the silicon-containing film satisfies the above condition.

$$SiX_4 \quad (1)$$

wherein X individually represent an alkoxy group or a halogen atom.

X in the formula (1) may be either the same or different. Specifically, when X represent an alkoxy group, the alkoxy groups may be either the same or different. When X represent a halogen atom, the halogen atoms may be either the same or different.

The number of carbon atoms included in the alkoxy group is preferably 1 to 8. Examples of the halogen atom include a fluorine atom, a chlorine atom, a bromine atom, and an iodine atom.

Specific examples of the compound shown by the formula (1) include tetramethoxysilane, tetraethoxysilane, tetra-n-propoxysilane, tetraisopropoxysilane, tetra-n-butoxysilane, tetra-sec-butoxysilane, tetra-tert-butoxysilane, tetrachlorosilane, tetrakis(2-ethylbutoxy)silane, and the like.

Among these, tetramethoxysilane, tetraethoxysilane, tetra-n-propoxysilane, tetraisopropoxysilane, tetra-n-butoxysilane, and tetra-sec-butoxysilane are preferable.

These compounds shown by the formula (1) may be used either individually or in combination.

The polysiloxane (A) may include only one type of structural unit derived from the compound shown by the formula (1), or may include two or more types of structural unit derived from the compound shown by the formula (1).

The polysiloxane (A) may include a structural unit derived from a compound shown by the following formula (2) (hereinafter may be referred to as "structural unit (2)") in addition to the structural unit derived from the compound shown by the formula (1).

$$R^1_m SiX_{(4-m)} \quad (2)$$

wherein $R^1$ individually represent a hydrogen atom, a halogen atom, or a monovalent organic group (excluding an alkoxy group), X individually represent an alkoxy group, and m is an integer from 1 to 3.

Examples of the compound shown by the formula (2) include the compounds disclosed in Japanese Patent Application Publication (KOKAI) No. 2008-170984 and Japanese Patent Application Publication (KOKAI) No. 2008-3624.

Specific examples of the structural unit derived from the compound shown by the formula (2) include structural units derived from monomers such as methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane,
phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-t-butoxysilane, phenyltriacetoxysilane, tolyltrimethoxysilane, vinyltrimethoxysilane, (3-glycidoxypropyl)trimethoxysilane, (3-glycidoxypropyl)triethoxysilane, 3-ethyl-3-(trimethoxysilylpropoxymethyl)oxetane, 3-ethyl-3-(triethoxysilylpropoxymethyl)oxetane,
3-(trimethoxysilyl)propyl methacrylate, 3-(triethoxysilyl)propyl methacrylate, N-3-(methacryloxy-2-hydroxypropyl)-3-aminopropyltriethoxysilane, 2-(trimethoxysilyl)ethyl methacrylate, 2-(triethoxysilyl)ethyl methacrylate, trimethoxysilylmethyl methacrylate, triethoxysilylmethyl methacrylate, 3-(trimethoxysilyl)propyl acrylate, and 3-(triethoxysilyl)propyl acrylate,
dimethyldimethoxysilane, diethyldimethoxysilane, dipropyldimethoxysilane, diphenyldimethoxysilane, (3-acryloxypropyl)methyldimethoxysilane, 3-methacryloxypropylmethyldiethoxysilane, di(3-glycidoxypropyl)dimethoxysilane, di(3-glycidoxypropyl)diethoxysilane, (3-cyclohexenyl)propyldimethoxysilane, 1,4-bis(triethoxysilyl)benzene, vinyltriethoxysilane, and 2-(3,4-epoxycyclohexyl)ethyltrimethoxysilane.

Among these, a structural unit derived from a compound shown by the following formula (2-1) is preferable.

$$R^2_m SiX_{(4-m)} \quad (2-1)$$

wherein $R^2$ individually represent a hydrogen atom, an alkyl group, or a halogen atom, X individually represent an alkoxy group, and m is an integer from 1 to 3.

Specific examples of the structural unit derived from the compound shown by the formula (2-1) include structural units derived from monomers such as methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, dimethyldimethoxysilane, diethyldimethoxysilane, and dipropyldimethoxysilane.

The polysiloxane (A) may include only one type of structural unit (2), or may include two or more types of structural unit (2).

The content of the structural unit (2) in the polysiloxane (A) is normally 10 to 90 mol %, and preferably 20 to 90 mol %, based on the total amount (=100 mol %) of the structural units (1) and (2). If the content of the structural unit (2) is 10 to 90 mol %, adhesion to a resist pattern is further improved.

The content of each structural unit may be estimated from $^{29}$Si-NMR spectrum analysis results or the weight average molecular weight, for example.

The polystyrene-reduced weight average molecular weight (hereinafter referred to as "Mw") of the polysiloxane (A) determined by gel permeation column chromatography (GPC) is preferably 500 to 15,000, more preferably 1000 to 10,000, and still more preferably 1500 to 6000. When the Mw of the polysiloxane (A) is 500 to 15,000, excellent applicability and excellent storage stability are obtained.

The polysiloxane (A) may be produced by an arbitrary method. For example, the polysiloxane (A) may be produced by subjecting the compound (starting raw material) that produces each structural unit to hydrolysis and condensation. Specifically, the polysiloxane (A) may be produced by dissolving the starting raw materials in an organic solvent, and subjecting the starting raw materials to hydrolysis and condensation while adding water intermittently or continuously to the solution. A catalyst may be dissolved or dispersed in the organic solvent, or may be dissolved or dispersed in water added to the solution. The hydrolysis-condensation temperature is normally 0 to 100° C.

When producing the polysiloxane (A), it is possible to (1) subject a mixture of the starting raw materials (compounds) to hydrolysis and condensation, or (2) effect hydrolysis and condensation using at least one of a hydrolyzate and a condensate of each compound, or at least one of a hydrolyzate and a condensate of a mixture of desired compounds.

It is preferable to use ion-exchange water for hydrolysis and condensation. Water is used in an amount of 0.25 to 3 mol, and preferably 0.3 to 2.5 mol, per 1 mol of alkoxy groups included in the compounds used as the raw materials. If the amount of water is within the above range, a deterioration in uniformity of the resulting film and a decrease in storage stability of the resulting composition can be suppressed.

The organic solvent is not particularly limited insofar as the organic solvent is used for the above application. For example, it is preferable to use an alcohol solvent such as methanol, ethanol, 1-propanol, 2-propanol, ethylene glycol, propylene glycol, diethylene glycol monomethyl ether, diethylene glycol monobutyl ether, triethylene glycol monomethyl ether, triethylene glycol monobutyl ether, diethylene glycol mono isobutyl ether, diethylene glycol monohexyl ether, diethylene glycol mono-2-ethylhexylethanol, diethylene glycol monobenzyl ether, or dipropylene glycol monomethyl ether in order to advantageously control the polymerization reaction.

The catalyst is not particularly limited insofar as the catalyst is used for the above application. Examples of the catalyst include metal chelate compounds, organic acids, inorganic acids, organic bases, inorganic bases, and the like. It is preferable to use an organic acid or an organic base from the viewpoint of productivity.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, and the like.

Examples of the inorganic acid include hydrochloric acid, nitric acid, sulfuric acid, hydrofluoric acid, phosphoric acid, and the like.

Examples of the organic base include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, and the like.

Examples of the inorganic base include ammonia, sodium hydroxide, potassium hydroxide, barium hydroxide, calcium hydroxide, and the like.

Among these, it is preferable to use a metal chelate compound, an organic acid, or an inorganic acid. It is particularly preferable to use a titanium chelate compound or an organic acid.

These catalysts may be used either individually or in combination.

The catalyst is preferably used in an amount of 0.001 to 10 parts by mass, and more preferably 0.01 to 10 parts by mass, based on 100 parts by mass of the raw material compounds in total.

After completion of hydrolysis and condensation, it is preferable to remove reaction by-products such as lower alcohols (e.g., methanol and ethanol). This increases the purity of the organic solvent, so that a composition that exhibits excellent applicability and excellent storage stability can be obtained.

The reaction by-products may be removed by an arbitrary method insofar as the reaction of the hydrolyzate or the condensate does not proceed. For example, when the boiling point of the reaction by-products is lower than the boiling point of the organic solvent, the reaction by-products may be removed by evaporation under reduced pressure.

The resin composition may include only one type of the polysiloxane (A), or may include two or more types of the polysiloxane (A).

(2) Organic Solvent (B)

The organic solvent (B) is not particularly limited insofar as the organic solvent (B) dissolves the polysiloxane (A). Examples of the organic solvent (B) include aliphatic hydrocarbon solvents, aromatic hydrocarbon solvents, monohydric alcohol solvents, polyhydric alcohol solvents, ketone solvents, ether solvents, ester solvents, nitrogen-containing solvents, sulfur-containing solvents, and the like. Among these, it is preferable to use a propylene glycol monoalkyl ether such as propylene glycol-1-propyl ether or propylene glycol 1-ethyl ether, or a monohydric alcohol solvent such as ethanol, isopropanol, or butanol from the viewpoint of the stability of the polysiloxane (A) in the resin composition.

These organic solvents (B) may be used either individually or in combination.

(3) Additional Component (i)

(3-1) Acid Generator Compound

The resin composition according to one embodiment of the invention may include an acid generator compound (hereinafter may be referred to as "acid generator") that generates an acid upon exposure to ultraviolet rays and/or heating in addition to the polysiloxane and the organic solvent.

When the resin composition includes the acid generator, an acid is generated in the silicon-containing film by exposing the resist or heating the resist after exposure, and is supplied to the interface between the silicon-containing film and the resist film. A resist pattern that exhibits excellent resolution and excellent reproducibility can be formed by then subjecting the resist film to alkali development.

Examples of the acid generator include a compound that generates an acid upon heating (hereinafter may be referred to as "latent thermal acid generator") and a compound that generates an acid upon exposure to ultraviolet rays (hereinafter may be referred to as "latent photoacid generator").

The latent thermal acid generator is a compound that generates an acid when the compound is heated to 50 to 450° C. (preferably 200 to 350° C.).

Examples of the latent thermal acid generator include onium salts such as sulfonium salts, benzothiazolium salts, ammonium salts, and phosphonium salts (e.g., the latent thermal acid generators disclosed in Japanese Patent Application Publication (KOKAI) No. 2008-170984 and Japanese Patent Application Publication (KOKAI) No. 2008-3624). Among these, sulfonium salts such as alkylsulfonium salts such as 4-acetoxyphenyldimethylsulfonium hexafluoroantimonate, 4-acetoxyphenyldimethylsulfonium hexafluoroarsenate, dimethyl-4-(benzyloxycarbonyloxy)phenylsulfonium hexafluoroantimonate, dimethyl-4-(benzoyloxy)phenylsulfonium hexafluoroantimonate, dimethyl-4-(benzoyloxy)phenylsulfonium hexafluoroarsenate, and dimethyl-3-chloro-4-acetoxyphenylsulfonium hexafluoroantimonate; benzylsulfonium salts such as benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroantimonate, benzyl-3-chloro-4-hydroxyphenylmethylsulfonium hexafluoroarsenate, 4-methoxybenzyl-4-hydroxyphenylmethylsulfonium hexafluorophosphate, benzointosylate, and 2-nitrobenzyltosylate;
dibenzylsulfonium salts such as dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate, and benzyl-4-methoxybenzyl-4-hydroxyphenylsulfonium hexafluorophosphate; and substituted benzylsulfonium salts such as p-chlorobenzyl-4-hydroxyphenylmethylsulfonium hexafluoroantimonate, p-nitrobenzyl-4-hydroxyphenylmethylsulfonium hexafluoroantimonate, p-chlorobenzyl-4-hydroxyphenylmethylsulfonium hexafluorophosphate, p-nitrobenzyl-3-methyl-4-hydroxyphenylmethylsulfonium hexafluoroantimonate, 3,5-dichlorobenzyl-4-hydroxyphenylmethylsulfonium hexafluoroantimonate, and o-chlorobenzyl-3-chloro-4-hydroxyphenylmethylsulfonium hexafluoroantimonate are preferable.

The latent photoacid generator is a compound that generates an acid upon exposure to ultraviolet rays at a dose of 1 to 100 mJ (preferably 10 to 50 mJ). Examples of the photoacid generator include onium salt photoacid generators, halogen-containing compound photoacid generators, sulfonic acid compound photoacid generators, and the like. Among these, it is preferable to use an onium salt photoacid generator (e.g., diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-tert-butylphenyl)iodonium trifluoromethanesulfonate, triphenylsulfonium trifluoromethanesulfonate, triphenylsulfonium hexafluoroantimonate, triphenylsulfonium naphthalenesulfonate, triphenylsulfonium nonafluoro-n-butanesulfonate, and triphenylsulfonium camphorsulfonate) from the viewpoint of mutual solubility with the polysiloxane (A) and the organic solvent (B).

These acid generators may be used either individually or in combination.

The acid generator is normally used in an amount of 0.01 to 10 parts by mass based on 100 parts by mass (solid content) of the polysiloxane (A).

(4) Additional Component (ii)

The resin composition according to one embodiment of the invention may further include a β-diketone in order to improve the uniformity of the resulting film and the storage stability of the resin composition. The resin composition may further include colloidal silica, colloidal alumina, an organic polymer, a surfactant, and the like.

[2] Pattern-Forming Method

A pattern-forming method according to one embodiment of the invention includes (1) forming a silicon-containing film on a substrate, the silicon-containing film having a mass ratio of silicon atoms to carbon atoms of 2 to 12 (hereinafter may be referred to as "step (1)"), (2) forming a shape transfer target layer on the silicon-containing film, and transferring a fine pattern to the shape transfer target layer using a stamper that has a fine pattern to form a resist pattern (hereinafter may be referred to as "step (2)"), and (3) dry-etching the silicon-containing film and the substrate using the resist pattern as a mask to form a pattern on the substrate (hereinafter may be referred to as "step (3)").

According to the above pattern-forming method, since the silicon-containing film exhibits excellent oxygen ashing resistance (oxygen etching resistance), a pattern can be precisely transferred to the substrate with excellent reproducibility in a dry-etching process.

Step (1)

In the step (1), a silicon-containing film (20 in FIG. 1A) is formed on a substrate (10 in FIG. 1A) by applying the above resin composition, or using chemical vapor deposition, physical vapor deposition, molecular beam epitaxy, or the like. A substrate provided with a silicon-containing film (i.e., the substrate on which a silicon-containing film is formed) is thus obtained.

Examples of the substrate include an insulation film formed of silicon oxide, silicon nitride, silicon oxynitride, polysiloxane, or the like, and an interlayer dielectric film (e.g., a wafer covered with a low-dielectric-constant insulation film (e.g., Black Diamond (manufactured by AMAT), SiLK (manufactured by Dow Chemical), or LKD5109 (manufactured by JSR Corp.)). A patterned substrate having a trench, a via, and the like may also be used.

A resist underlayer film (i.e., a resist underlayer film other than the silicon-containing film formed using the resin composition according to one embodiment of the invention) may be formed on the substrate in advance.

The term "resist underlayer film" used herein refers to a film that compensates for the function of the silicon-containing film and/or the resist underlayer film, or exhibits the desired function (e.g., anti-reflective function, flatness, or etching resistance when etched using a fluorine-containing gas ($CF_4$) when forming a resist pattern.

The resist underlayer film may be formed using a commercially available material such as "NFC HM8005" (manufactured by JSR Corp.), for example.

The resist underlayer film may be formed by an arbitrary method. For example, the resist underlayer film may be formed by applying a resist underlayer film-forming material to the substrate by spin coating or the like to form a film, and curing the film by exposure and/or heating.

Examples of radiation used for exposure include visible rays, ultraviolet rays, deep ultraviolet rays, X-rays, electron beams, γ-rays, molecular beams, ion beams, and the like.

The heating temperature is not particularly limited, but is preferably 90 to 550° C., more preferably 90 to 450° C., and still more preferably 90 to 300° C.

The thickness of the resist underlayer film is not particularly limited, but is preferably 100 to 20,000 nm.

The description of the section entitled "[1] Silicon-containing film" may be applied to the silicon-containing film-forming method and the thickness of the silicon-containing film employed in the step (1).

Step (2)

Figure 1B:
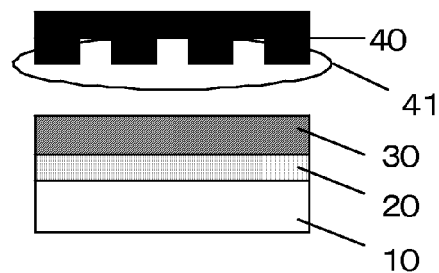
Figure 1C:
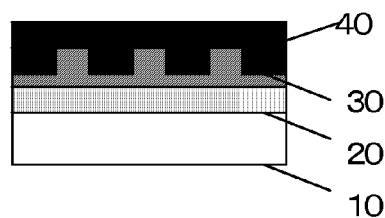
Figure 1D:
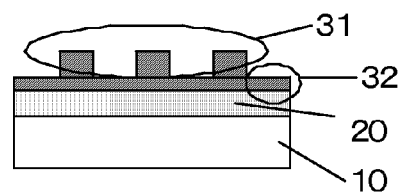

In the step (2), a shape transfer target layer (30 in FIG. 1A) is formed on the silicon-containing film (20 in FIG. 1A), and a fine pattern is transferred to the shape transfer target layer using a stamper (40 in FIG. 1B) that has a fine pattern to form a resist pattern (31 in FIG. 1D). In the step (2), a fine pattern is normally transferred to the shape transfer target layer by pressing an elevation/depression pattern (41 in FIG. 1B) of the stamper against the shape transfer target layer to form a resist pattern.

The pressure applied when pressing the elevation/depression pattern pressing an elevation/depression pattern is not particularly limited, but is normally 0.1 to 100 MPa. The pressure is preferably 0.1 to 50 MPa, more preferably 0.1 to 30 MPa, and particularly preferably 0.1 to 20 MPa.

The pressing time is not particularly limited, but is normally 1 to 600 seconds. The pressing time is preferably 1 to 300 seconds, more preferably 1 to 180 seconds, and particularly preferably 1 to 120 seconds.

The step (2) may further include curing the elevation/depression pattern (resist pattern) transferred (formed) by the pattern-forming step (curing step). Specifically, the step (2) may further include curing the layer to which the fine pattern has been transferred. This makes it possible to improve adhesion between the resist pattern and the silicon-containing film.

The curing step may be performed after or simultaneously with the pattern-forming step. When performing the curing step simultaneously with the pattern-forming step, the stamper that is pressed against the shape transfer target layer and/or the shape transfer target layer to which the elevation/depression pattern has been transferred may be heated or exposed to radiation.

The curing step may be performed by an arbitrary method (e.g., exposure or heating). It is preferable to appropriately select the curing method depending on the properties of a shape transfer target layer-forming composition used to form the shape transfer target layer.

For example, the curing step may be performed by exposure when a compound included in the shape transfer target layer-forming composition is radiation-curable (i.e., photocurable compound). The curing step may be performed by heating when the compound is heat-curable (i.e., heat-curable compound). A curing accelerator may be used when the compound does not have sensitivity, and the shape transfer target layer may be cured by exposure and/or heating depending on the properties of the curing accelerator. A fine pattern can thus be formed on the surface of the shape transfer target layer.

The compound encompasses a low-molecular-weight compound (formula weight: 100 or less), an oligomer (a compound having a polystyrene-reduced weight average molecular weight determined by gel permeation column chromatography (hereinafter may be referred to as "weight average molecular weight") of 1000 or less), and a high-molecular-weight compound (weight average molecular weight: higher than 1000).

It is preferable to cure the shape transfer target layer by a method that utilizes photolithography. It is particularly preferable that the shape transfer target layer-forming composition includes the compound and a photocuring accelerator (e.g., photoacid generator) for curing the compound, so that the compound is cured when the photocuring accelerator is exposed. Specifically, the pattern-forming method according to one embodiment of the invention preferably utilizes nanoimprint photolithography.

Examples of radiation used for exposure include, but are not limited to, visible rays, ultraviolet rays, deep ultraviolet rays, X-rays, charged particle beams such as electron beams, and the like (including ArF excimer laser light (wavelength: 193 nm) and KrF excimer laser light (wavelength: 248 nm)). The entire surface of the shape transfer target layer may be exposed, or only part of the shape transfer target layer may be exposed. The shape transfer target layer may be exposed after removing the stamper, or may be exposed through the stamper that allows light to pass through.

The atmosphere, the heating temperature, and the like employed when curing the shape transfer target layer by heating are not particularly limited. For example, the shape transfer target layer may be heated 30 to 200° C. (or 50 to 170° C.) in an inert atmosphere or under reduced pressure. A hot plate, an oven, a furnace, or the like may be used when heating the shape transfer target layer. The shape transfer target layer may be heated after exposure, or may be heated during exposure. When heating the shape transfer target layer during exposure, a crosslinking reaction of the compound included in the exposed film proceeds more smoothly. When heating the shape transfer target layer during the pattern-forming step, the shape transfer target layer may be cured by indirectly heating the patterned film by heating the stamper.

The term "shape transfer target layer" refers to a layer to which the elevation/depression pattern of the stamper is transferred (i.e., a layer on which a fine pattern is formed). A fine pattern is transferred to the shape transfer target layer to obtain a patterned film (31 and 32 in FIG. 1D) having a fine pattern. The patterned film having a fine pattern may be used as an interlayer dielectric of a semiconductor device (e.g., LSI, system LSI, DRAM, SDRAM, RDRAM, or D-RDRAM), a resist film used when producing a semiconductor device, or the like.

The components of the shape transfer target layer are not particularly limited. The shape transfer target layer normally includes a curable compound. Examples of the compound included in the shape transfer target layer include (meth) acrylic compounds, epoxy compounds, vinyl ether compounds, oxetane compounds, vinyl compounds, and the like.

When the compound is not radiation-curable (photocurable) and/or heat-curable, the shape transfer target layer may include a curing accelerator in addition to the compound. Examples of the curing accelerator include a photocuring accelerator and a heat-curing accelerator. Among these, it is preferable to use the photocuring accelerator. The photocuring accelerator may be appropriately selected depending on the structural unit included in the compound. For example, a photoacid generator, a photobase generator, a photo-radical generator, a photosensitizer, or the like may be used. These photocuring accelerators may be used either individually or in combination.

The shape transfer target layer may also include an acid diffusion controller (e.g., amine), a surfactant, and the like. The shape transfer target layer-forming composition used to form the shape transfer target layer may further include a solvent and the like.

The shape transfer target layer may be formed by an arbitrary method using the shape transfer target layer-forming composition. The shape transfer target layer may be formed directly on the substrate by spin coating, cast coating, roll coating, or the like. Alternatively, a film separately formed in advance may be dried to form a sheet, cut to the desired size, and bonded to the substrate to obtain the shape transfer target layer. The shape transfer target layer may also be formed by another method. The thickness of the shape transfer target layer is not particularly limited, but is normally 1 to 1000 nm.

Step (3)

Figure 1E:
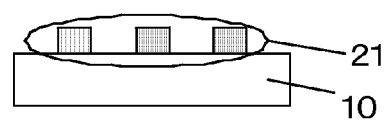
Figure 1F:
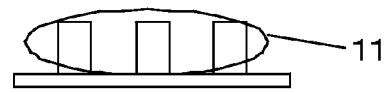

In the step (3), a residual layer (32 in FIG. 1D), the silicon-containing film (20 in FIG. 1D), and the substrate (mark 10 in FIG. 1D) are dry-etched using the resist pattern (31 in FIG. 1D) formed by the step (2) as a mask to form a pattern (11 in FIG. 1F). For example, the silicon-containing film is dry-etched using the resist pattern as a mask, and the substrate is then dry-etched using the resulting silicon-containing film pattern (21 in FIG. 1E) as a mask to form a specific pattern (11 in FIG. 1F) (see FIG. 1D, FIG. 1E and FIG. 1F). The silicon-containing film and the substrate may be dry-etched using the resist pattern as a mask to form a specific pattern (11 in FIG. 1F) without performing the step shown in FIG. 1E. When using the substrate on which the resist underlayer film is formed, the resist underlayer film is dry-etched together with the silicon-containing film and the substrate.

The silicon-containing film and the substrate may be dry-etched using a known dry-etching system.

As the source gas used for dry-etching, an oxygen-containing gas (e.g., $O_2$, CO, or $CO_2$), an inert gas (e.g., He, $N_2$, or Ar), a chlorine-containing gas (e.g., $Cl_2$ or $BCl_4$), $H_2$, $NH_3$, or the like may be used depending on the elemental composition of the etching target film. A mixture of these gases may also be used.

The pattern-forming method according to one embodiment of the invention can form a desired substrate processing pattern by appropriately performing the steps (1) to (3). Moreover, a pattern can be advantageously transferred to the substrate with excellent reproducibility.

EXAMPLES

The invention is further described below by way of examples. Note that the invention is not limited to the following examples. In the examples and comparative examples, the unit "parts" refers to "parts by mass", and the unit "%" refers to "mass %" unless otherwise indicated.

[1] Synthesis of Polymer (Polysiloxane (A))

In each synthesis example, a polymer was synthesized using the following monomers.

Compound (M-1): tetramethoxysilane
Compound (M-2): methyltrimethoxysilane
Compound (M-3): 3-ethyl-3-(trimethoxysilylpropoxymethyl)oxetane
Compound (M-4): (3-glycidoxypropyl)trimethoxysilane
Compound (M-5): phenyltrimethoxysilane
Compound (M-6): tolyltrimethoxysilane
Compound (M-7): 3-(trimethoxysilyl)propyl methacrylate
Compound (M-8): ethyltrimethoxysilane
Compound (M-9): 2-(3,4-epoxycyclohexyl)ethyltrimethoxysilane
Compound (M-10): vinyltrimethoxysilane
Compound (M-11): 1,4-bis(triethoxysilyl)benzene

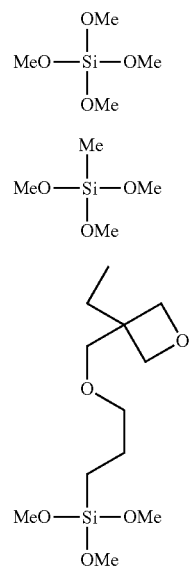

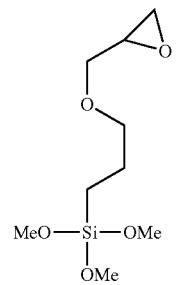

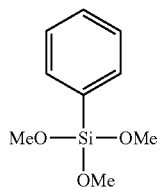

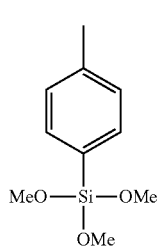

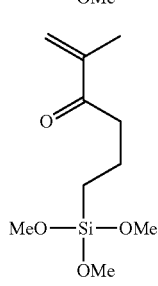

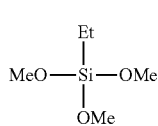

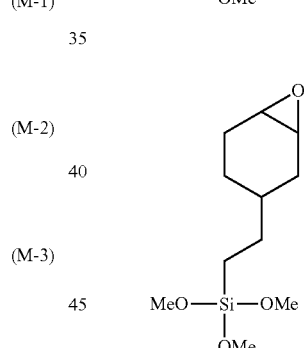

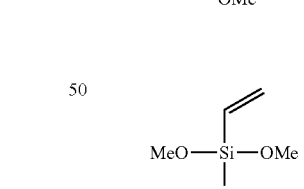

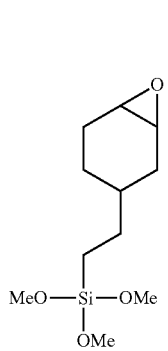

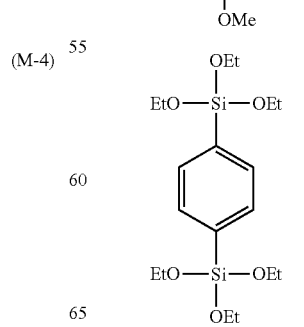

Note that the symbol "Me" indicates a methyl group, the symbol "Et" indicates an ethyl group, and the symbol "Ph" indicates a phenyl group.

Synthesis Example 1

Synthesis of Polysiloxane (A-1)

0.45 g of oxalic acid was dissolved in 21.6 g of water with heating to prepare an oxalic acid aqueous solution. A flask charged with 12.2 g of tetramethoxysilane (compound shown by the formula (M-1)), 2.7 g of methyltrimethoxysilane (compound shown by the formula (M-2)), and 53.5 g of propylene glycol 1-ethyl ether was fitted with a cooling tube and a dropping funnel containing the oxalic acid aqueous solution. After heating the mixture to 60° C. using an oil bath, the oxalic acid aqueous solution was slowly added dropwise to the mixture, and the mixture was reacted at 60° C. for 4 hours. After completion of the reaction, the flask containing the reaction solution was allowed to cool, and installed on an evaporator. Methanol produced during the reaction was removed to obtain 41 g of a resin solution. The solid contained in the resin solution is referred to as "polysiloxane (A-1)". The weight average molecular weight (Mw) of the solid was 1800.

In the examples, the weight average molecular weight (Mw) was measured by the following method.

<Measurement of Weight Average Molecular Weight (Mw)>

The weight average molecular weight (Mw) was measured by gel permeation column chromatography (GPC) using GPC columns manufactured by Tosoh Corp. (G2000HXL×2, G3000HXL×1, G4000HXL×1) (standard: monodisperse polystyrene, flow rate: 1.0 ml/min, eluant: tetrahydrofuran, column temperature: 40° C.).

Synthesis Example 2

Synthesis of Polysiloxane (A-2)

3.65 g of tetramethylammonium hydroxide was dissolved in 10.94 g of water with heating to prepare a tetraammonium hydroxide aqueous solution. A flask charged with 14.59 g of the tetraammonium hydroxide aqueous solution, 4.53 g of water, and 40 g of methanol was fitted with a cooling tube and a dropping funnel containing 1.5 g of tetramethoxysilane (compound shown by the formula (M-1)), 12.3 g of methyl-trimethoxysilane (compound shown by the formula (M-2)), and 50 g of methanol. After heating the mixture to 60° C. using an oil bath, the monomer methanol solution was slowly added dropwise to the mixture, and the mixture was reacted at 50° C. for 2 hours. After completion of the reaction, the flask containing the reaction solution was allowed to cool.

The reaction solution was then added dropwise to 42.54 g of a maleic acid methanol solution separately prepared by dissolving 5.10 g of maleic anhydride in 18.72 g of water and 18.72 g of methanol. The mixture was then stirred for 30 minutes. After the addition of 50 g of 4-methyl-2-pentenone, the flask was installed on an evaporator. The reaction solvent and methanol produced during the reaction were then removed to obtain a 4-methyl-2-pentenone resin solution. The resin solution was transferred to a separating funnel, washed with 40 g of water, and then washed with 20 g of water. After the addition of 50 g of propylene glycol 1-ethyl ether to the 4-methyl-2-pentenone resin solution that had been transferred to a flask from the separating funnel, the flask was installed on an evaporator, and 4-methyl-2-pentenone was removed to obtain 39 g of a resin solution. The solid contained in the resin solution is referred to as "polysiloxane (A-2)".

Synthesis Examples 3 to 14

Synthesis of Polysiloxanes (A-3) to (A-14)

<Polysiloxanes (A-3), (A-4), (A-7), (A-9), (A-10), and (A-12) to (A-14)>

Polysiloxanes (A-3), (A-4), (A-7), (A-9), (A-10), and (A-12) to (A-14) were synthesized in the same manner as in Synthesis Example 1, except for using monomers shown in Table 1 in amounts shown in Table 1.

<Polysiloxanes (A-5), (A-6), (A-8), and (A-11)>

Polysiloxanes (A-5), (A-6), (A-8), and (A-11) were synthesized in the same manner as in Synthesis Example 2, except for using monomers shown in Table 1 in amounts shown in Table 1.

The amount of each monomer and the weight average molecular weight (Mw) of the solid contained in the resin solutions obtained in Synthesis Examples 2 to 14 were measured in the same manner as in Synthesis Example 1. The results are shown in Table 1. Table 1 also shows the resin composition (theoretical value (mol %)) determined from the amount of each monomer.

TABLE 1

| | Polysiloxane | Monomer | Amount (g) | Content (mol %) | MW |
|---|---|---|---|---|---|
| Synthesis Example 1 | A-1 | M-1 | 12.2 | 80 | 1800 |
| | | M-2 | 2.7 | 20 | |
| Synthesis Example 2 | A-2 | M-1 | 1.5 | 10 | 2500 |
| | | M-2 | 12.3 | 90 | |
| Synthesis Example 3 | A-3 | M-1 | 10.7 | 70 | 1500 |
| | | M-2 | 3.8 | 28 | |
| | | M-3 | 0.6 | 2 | |
| Synthesis Example 4 | A-4 | M-1 | 10.7 | 70 | 1500 |
| | | M-2 | 3.8 | 28 | |
| | | M-4 | 0.5 | 2 | |
| Synthesis Example 5 | A-5 | M-1 | 9.1 | 60 | 4000 |
| | | M-2 | 4.1 | 33 | |
| | | M-5 | 1.4 | 7 | |
| Synthesis Example 6 | A-6 | M-1 | 9.1 | 60 | 3500 |
| | | M-2 | 4.8 | 35 | |
| | | M-6 | 1.1 | 5 | |
| Synthesis Example 7 | A-7 | M-1 | 10.7 | 70 | 1300 |
| | | M-2 | 3.8 | 28 | |
| | | M-7 | 0.5 | 2 | |
| Synthesis Example 8 | A-8 | M-1 | 9.1 | 60 | 3900 |
| | | M-2 | 4.0 | 29 | |
| | | M-5 | 1.0 | 5 | |
| | | M-7 | 1.5 | 6 | |
| Synthesis Example 9 | A-9 | M-2 | 13.6 | 100 | 1500 |
| Synthesis Example 10 | A-10 | M-8 | 15.0 | 100 | 1500 |
| Synthesis Example 11 | A-11 | M-2 | 6.8 | 50 | 3200 |
| | | M-7 | 12.4 | 50 | |
| Synthesis Example 12 | A-12 | M-1 | 13.7 | 90 | 4000 |
| | | M-2 | 0.7 | 5 | |
| | | M-9 | 1.2 | 5 | |
| Synthesis Example 13 | A-13 | M-1 | 12.9 | 85 | 3000 |
| | | M-2 | 0.7 | 5 | |
| | | M-10 | 1.9 | 10 | |
| Synthesis Example 14 | A-14 | M-1 | 12.2 | 80 | 3000 |
| | | M-2 | 1.8 | 13 | |
| | | M-11 | 2.2 | 7 | |

[2] Production of Silicon-Containing Film

Example 1

10.9 parts of the polysiloxane (A-1) obtained in each synthesis example was dissolved in 73.5 parts of a solvent (B-1) and 15.6 parts of a solvent (B-2) (see Table 2). The solution was filtered through a filter having a pore size of 0.2 μm to obtain a resin composition. The resin composition was applied to the surface of a silicon wafer using a spin coater at 2000 rpm for 20 seconds, and dried on a hot plate at 250° C. for 60 seconds to form a silicon-containing film (thickness: 45 nm).

Examples 2 to 13 and Comparative Examples 1 and 2

A silicon-containing film was formed in the same manner as in Example 1, except for using components shown in Table 2 in amounts shown in Table 2.

The details of the solvent (B) and the acid generator (C) shown in Table 2 are given below.
(B-1): propylene glycol 1-propyl ether
(B-2): propylene glycol 1-ethyl ether
(C-1): triphenylsulfonium trifluoromethanesulfonate The mass ratio (silicon atom/carbon atom) of silicon atoms to carbon atom in each silicon-containing film, and the silicon atom content (mass %) in each silicon-containing film based on total atoms included in each silicon-containing film were measured (calculated) by the following method. The results are shown in Table 2.

(Measuring Method)

The silicon-containing film was shaved off, and the carbon atom content, the silicon atom content, and the like were measured using an organic elementary analyzer ("CHN Corder JM10" manufactured by J-Science).

(1) Adhesion

A shape transfer target layer-forming composition ("TAK-01" manufactured by Toyo Gosei Co., Ltd.) was applied to the silicon-containing film using a bar coater (#2) to form a shape transfer target layer (thickness: 600 nm). A stamper having a 350 nm line/350 nm space pattern (aspect ratio: 1) was then pressed against the shape transfer target layer (1.5 MPa, 15 seconds). After applying light (15 seconds) using an LED lamp (wavelength: 375 nm, 2.5 mW/cm$^2$, 40 mJ/cm$^2$), the stamper was removed to obtain a resist pattern. The shape of the resist pattern was observed with the naked eye using an SEM ("S-4800" manufactured by Hitachi High-Tech Fielding Corporation) (magnification: 150,000). The shape of the resist pattern was evaluated in accordance with the following standard.

Acceptable: The resist pattern was not removed.
Unacceptable: The resist pattern was removed.

(2) Permeation of Resist

A shape transfer target layer-forming composition ("TAK-01" manufactured by Toyo Gosei Co., Ltd.) was applied to the silicon-containing film using a bar coater (#2), and washed with acetone for 1 minute. The amount of the shape transfer target layer-forming composition that permeated the silicon-containing film was then measured using a film thickness meter ("M-2000" manufactured by J. A. Woollam).

The measured thickness was evaluated as permeation of the resist. A case where the measured thickness was 10 angstroms or less was evaluated as "Acceptable", and a case where the measured thickness was more than 10 angstroms was evaluated as "Unacceptable".

(3) Oxygen Ashing Resistance

The silicon-containing film was subjected to an oxygen ashing treatment using an etching system ("EXAM" manufactured by Shinko Seiki Co., Ltd.) at 300 W for 15 seconds, and the difference between the thickness of the silicon-containing film before the oxygen ashing treatment and the thickness of the silicon-containing film after the oxygen ashing treatment was calculated. A case where the difference was 5 nm or less was evaluated as "Acceptable", and a case where the difference was more than 5 nm was evaluated as "Unacceptable".

TABLE 2

| | Polysiloxane (parts) | | Solvent (parts) | | Acid generator (parts) | Mass ratio of silicon atoms to carbon atoms | Silicon atom content (mass %) |
|---|---|---|---|---|---|---|---|
| Example 1 | A-1 (10.9) | | B-1 (73.5) | B-2 (15.6) | — | 11.7 | 46 |
| Example 2 | A-2 (10.4) | | B-1 (73.5) | B-2 (16.1) | — | 2.6 | 42 |
| Example 3 | A-3 (9.9) | | B-1 (73.5) | B-2 (16.6) | — | 5.1 | 43 |
| Example 4 | A-4 (13.3) | | B-1 (73.5) | B-2 (13.2) | — | 5.8 | 44 |
| Example 5 | A-5 (9.4) | | B-1 (73.5) | B-2 (17.1) | — | 3.6 | 41 |
| Example 6 | A-6 (10.7) | | B-1 (73.5) | B-2 (15.8) | — | 3.3 | 41 |
| Example 7 | A-7 (13.4) | | B-1 (73.5) | B-2 (13.1) | — | 5.6 | 44 |
| Example 8 | A-8 (13.8) | | B-1 (73.5) | B-2 (12.7) | — | 2.3 | 39 |
| Example 9 | A-1 (10.4) | A-9 (0.5) | B-1 (73.1) | B-2 (16.0) | — | 9.9 | 45 |
| Example 10 | A-2 (9.8) | A-9 (0.5) | B-1 (73.1) | B-2 (16.5) | C-1 (0.01) | 2.5 | 42 |
| Example 11 | A-12 (11.1) | | B-1 (73.5) | B-2 (15.4) | — | 5.2 | 43 |
| Example 12 | A-13 (12.2) | | B-1 (73.5) | B-2 (14.3) | — | 9.4 | 45 |
| Example 13 | A-14 (11.2) | | B-1 (73.5) | B-2 (15.3) | — | 4.6 | 43 |
| Comparative Example 1 | A-10 (12.0) | | B-1 (73.5) | B-2 (14.5) | — | 1.2 | 35 |
| Comparative Example 2 | A-11 (11.2) | | B-1 (73.5) | B-2 (15.3) | — | 0.6 | 24 |

[3] Evaluation of Silicon-Containing Film (Examples 1 to 13 and Comparative Examples 1 and 2)

The silicon-containing films obtained in Examples 1 to 13 and Comparative Examples 1 and 2 were evaluated as described below. The results are shown in Table 3.

TABLE 3

|  | Example |  |  |  |  |  |  |  |
|---|---|---|---|---|---|---|---|---|
|  | 1 | 2 | 3 | 4 | 5 | 6 | 7 | 8 |
| Adhesion | Acceptable | Acceptable | Acceptable | Acceptable | Acceptable | Acceptable | Acceptable | Acceptable |
| Permeation resistance (increase in thickness/angstroms) | Acceptable 2 | Acceptable 8 | Acceptable 4 | Acceptable 4 | Acceptable 5 | Acceptable 5 | Acceptable 4 | Acceptable 5 |
| Oxygen ashing resistance (change in thickness/nm) | Acceptable 1 | Acceptable 4 | Acceptable 2 | Acceptable 2 | Acceptable 2 | Acceptable 2 | Acceptable 2 | Acceptable 2 |

|  | Example |  |  |  |  | Comparative Example |  |
|---|---|---|---|---|---|---|---|
|  | 9 | 10 | 11 | 12 | 13 | 1 | 2 |
| Adhesion | Acceptable | Acceptable | Acceptable | Acceptable | Acceptable | Acceptable | Accept able |
| Permeation resistance (increase in thickness/angstroms) | Acceptable 8 | Acceptable 8 | Acceptable 3 | Acceptable 5 | Acceptable 3 | Unacceptable 15 | Unacceptable 22 |
| Oxygen ashing resistance (change in thickness/nm) | Acceptable 3 | Acceptable 4 | Acceptable 1 | Acceptable 2 | Acceptable 1 | Unacceptable 8 | Unacceptable 11 |

As clear from Table 3, the silicon-containing films obtained in Examples 1 to 13 exhibited excellent adhesion to the resist pattern formed thereon, suppressed permeation of the shape transfer target layer, and exhibited excellent oxygen ashing resistance. Accordingly, the silicon-containing films obtained in Examples 1 to 13 may suitably be used as a silicon-containing film used for a multilayer resist process employed in nanoimprint lithography.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
   forming a silicon-containing film on a substrate, the silicon-containing film having a mass ratio of silicon atoms to carbon atoms of 2 to 12;
   forming a shape transfer target layer on the silicon-containing film;
   transferring a fine pattern to the shape transfer target layer using a stamper that has a fine pattern to form a resist pattern; and
   dry-etching the silicon-containing film and the substrate using the resist pattern as a mask to form a pattern on the substrate in nanoimprint lithography.

2. The pattern-forming method according to claim 1, wherein the silicon-containing film has a silicon atom content of 36 to 47 mass % based on total atoms included in the silicon-containing film.

3. The pattern-forming method according to claim 1, wherein the silicon-containing film includes a silicon atom, a carbon atom, and an oxygen atom.

4. A silicon-containing film comprising:
   silicon atoms; and
   carbon atoms, a mass ratio of silicon atoms to carbon atoms of 2 to 12, the silicon-containing film being used for a pattern-forming method employed in nanoimprint lithography, the method comprising:
   forming the silicon-containing film on a substrate;
   forming a shape transfer target layer on the silicon-containing film;
   transferring a fine pattern to the shape transfer target layer using a stamper that has a fine pattern to form a resist pattern; and
   dry-etching the silicon-containing film and the substrate using the resist pattern as a mask to form a pattern on the substrate.

5. A resin composition used to form the silicon-containing film according to claim 4, the resin composition comprising a resin including a structural unit obtained by hydrolyzing a compound shown by the following formula (1), $$SiX_4 \quad (1)$$

wherein X individually represent an alkoxy group or a halogen atom.

* * * * *